(12) United States Patent
Patel et al.

(10) Patent No.: US 11,532,916 B2
(45) Date of Patent: Dec. 20, 2022

(54) HIGH SPEED RJ45 CONNECTOR

(71) Applicant: Panduit Corp., Tinley Park, IL (US)

(72) Inventors: Satish I. Patel, Roselle, IL (US); Paul W. Wachtel, Arlington Heights, IL (US)

(73) Assignee: Panduit Corp., Tinley Park, IL (US)

( * ) Notice: Subject to any disclaimer, the term of this patent is extended or adjusted under 35 U.S.C. 154(b) by 926 days.

(21) Appl. No.: 16/336,229

(22) PCT Filed: Oct. 7, 2016

(86) PCT No.: PCT/US2016/055962
§ 371 (c)(1),
(2) Date: Mar. 25, 2019

(87) PCT Pub. No.: WO2018/067172
PCT Pub. Date: Apr. 12, 2018

(65) Prior Publication Data
US 2020/0021068 A1 Jan. 16, 2020

(51) Int. Cl.
*H01R 24/64* (2011.01)
*H01R 13/6467* (2011.01)
*H05K 1/02* (2006.01)
*H05K 1/18* (2006.01)

(52) U.S. Cl.
CPC ......... *H01R 24/64* (2013.01); *H01R 13/6467* (2013.01); *H05K 1/0228* (2013.01); *H05K 1/189* (2013.01)

(58) Field of Classification Search
CPC ... H01R 13/6467; H05K 1/0028; H05K 1/189

USPC .......................................................... 439/676
See application file for complete search history.

(56) References Cited

U.S. PATENT DOCUMENTS

| | | | | |
|---|---|---|---|---|
| 5,911,602 A | * | 6/1999 | Vaden | H01R 13/6467 439/676 |
| 6,116,964 A | * | 9/2000 | Goodrich | H01R 13/6467 439/676 |
| 6,196,880 B1 | * | 3/2001 | Goodrich | H01R 13/6467 439/676 |
| 6,530,810 B2 | * | 3/2003 | Goodrich | H01R 13/6466 439/676 |
| 7,168,993 B2 | * | 1/2007 | Hashim | H01R 13/6469 439/676 |
| 7,314,393 B2 | * | 1/2008 | Hashim | H01R 13/6469 439/676 |
| 7,819,703 B1 | * | 10/2010 | Walker | H01R 13/6467 439/541.5 |
| 7,857,667 B1 | * | 12/2010 | Wang | H01R 13/6466 439/676 |

(Continued)

*Primary Examiner* — Alexander Gilman
(74) *Attorney, Agent, or Firm* — Christopher S. Clancy; James H. Williams; Christopher K. Marlow

(57) ABSTRACT

A Rj45 plug (34) comprising: a housing (42,50) with an opening; a sled assembly (60,100,152,180) contained within the housing wherein the sled assembly (10,100,152,180) has a plurality of contacts (68,158,184) accessible via the opening; and a plug interface contact (PIC) cover (62,112,158, 182) at least partially surrounding a first contact of the plurality of contacts wherein the PIC cover (62,112,158,182) is electrically insulated from the first plug interface contact of the plurality of contacts and electrically connected to a second plug interface contact of the plurality of contacts.

4 Claims, 18 Drawing Sheets

(56) References Cited

U.S. PATENT DOCUMENTS

| | | | | |
|---|---|---|---|---|
| 8,128,432 B2* | 3/2012 | Jaouen | ............... | H01R 13/6464 |
| | | | | 439/620.01 |
| 8,167,661 B2* | 5/2012 | Straka | .................. | H01R 13/658 |
| | | | | 439/676 |
| 8,632,362 B2* | 1/2014 | Straka | .................. | H01R 13/516 |
| | | | | 439/607.38 |
| 8,801,473 B2* | 8/2014 | Fransen | ............. | H01R 13/6467 |
| | | | | 439/676 |
| 8,961,232 B2* | 2/2015 | Wang | .................. | H01R 13/719 |
| | | | | 439/620.01 |
| 9,136,647 B2* | 9/2015 | Straka | ..................... | H01F 38/14 |
| 9,680,254 B1* | 6/2017 | Nishikata | ................ | H01R 24/60 |
| 9,728,916 B1* | 8/2017 | Tsai | ..................... | H01R 13/516 |
| 9,780,479 B2* | 10/2017 | Guo | ....................... | H01R 24/62 |
| 10,122,124 B2* | 11/2018 | Daughtry, Jr. | ........ | H01R 13/405 |
| 2004/0137799 A1* | 7/2004 | Ciezak | .................... | H01R 24/64 |
| | | | | 439/676 |
| 2005/0202697 A1* | 9/2005 | Caveney | ................ | H01R 24/64 |
| | | | | 439/77 |
| 2006/0014410 A1* | 1/2006 | Caveney | ............. | H05K 1/0228 |
| | | | | 439/188 |
| 2012/0244752 A1* | 9/2012 | Patel | .................. | H01R 13/6461 |
| | | | | 439/620.22 |
| 2014/0256185 A1* | 9/2014 | Fransen | ............. | H01R 13/6467 |
| | | | | 439/626 |
| 2016/0056579 A1* | 2/2016 | Lindkamp | .......... | H01R 13/6466 |
| | | | | 439/620.21 |
| 2016/0111822 A1* | 4/2016 | Patel | ..................... | H01R 43/16 |
| | | | | 439/620.21 |
| 2017/0279234 A1* | 9/2017 | Tsai | .................. | H01R 13/6585 |

* cited by examiner

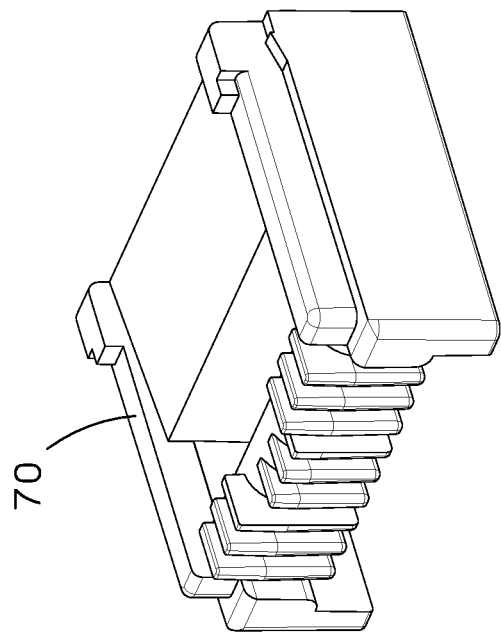
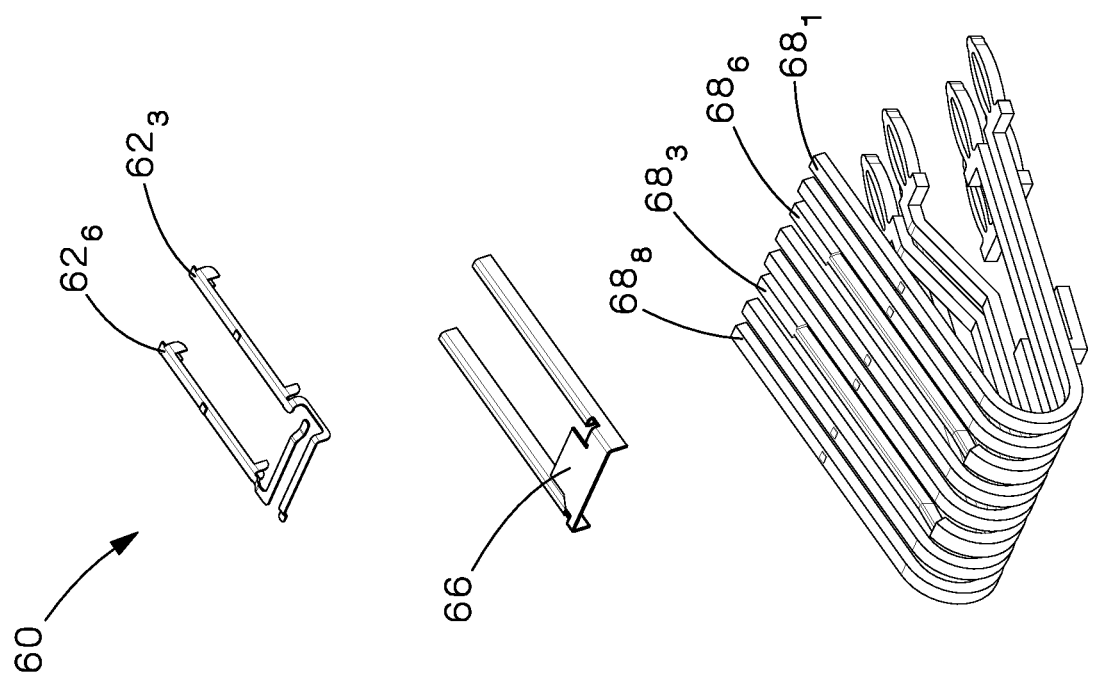
FIG.5

HIGH SPEED RJ45 CONNECTOR

FIELD OF THE INVENTION

The present invention relates generally to RJ45 type plug connectors and specifically to a high speed RJ45 connector which uses a plug interface contact (PIC) cover to switch the paths of the 3-6 split pair.

BACKGROUND OF THE INVENTION

RJ45 jack crosstalk compensation can generally be simplified by reducing the amount of crosstalk added by the jack's plug interface contacts and shortening the compensation distance from the plug/jack contact point (approximate location of the source of crosstalk in a mated plug and jack). Shortening of the compensation distance, reducing jack plug interface contact crosstalk, and placing the compensation at the interface on a non-current carrying stub simplifies the jack crosstalk compensation by reducing the phase delay between the plug/jack contact point and the jack crosstalk compensation network while reducing amount of crosstalk compensation.

SUMMARY OF THE INVENTION

In one embodiment, a high speed RJ45 connector has a housing with an opening. The housing contains a sled assembly. The sled assembly has a plurality of plug interface contacts with a plug interface contact (PIC) cover at least partially surrounding a first plug interface contact. The PIC cover is electrically insulated from the first plug interface contact and electrically connected to a second plug interface contact.

In one embodiment, a second PIC cover at least partially surrounds a third plug interface contact. The second PIC cover is electrically insulated from the third plug interface contact and is electrically connected to a fourth plug interface contact.

BRIEF DESCRIPTION OF FIGURES

FIG. 5 is an exploded isometric view of the front sled assembly of FIG. 4.

DETAILED DESCRIPTION OF THE PREFERRED EMBODIMENTS

Figure 1:
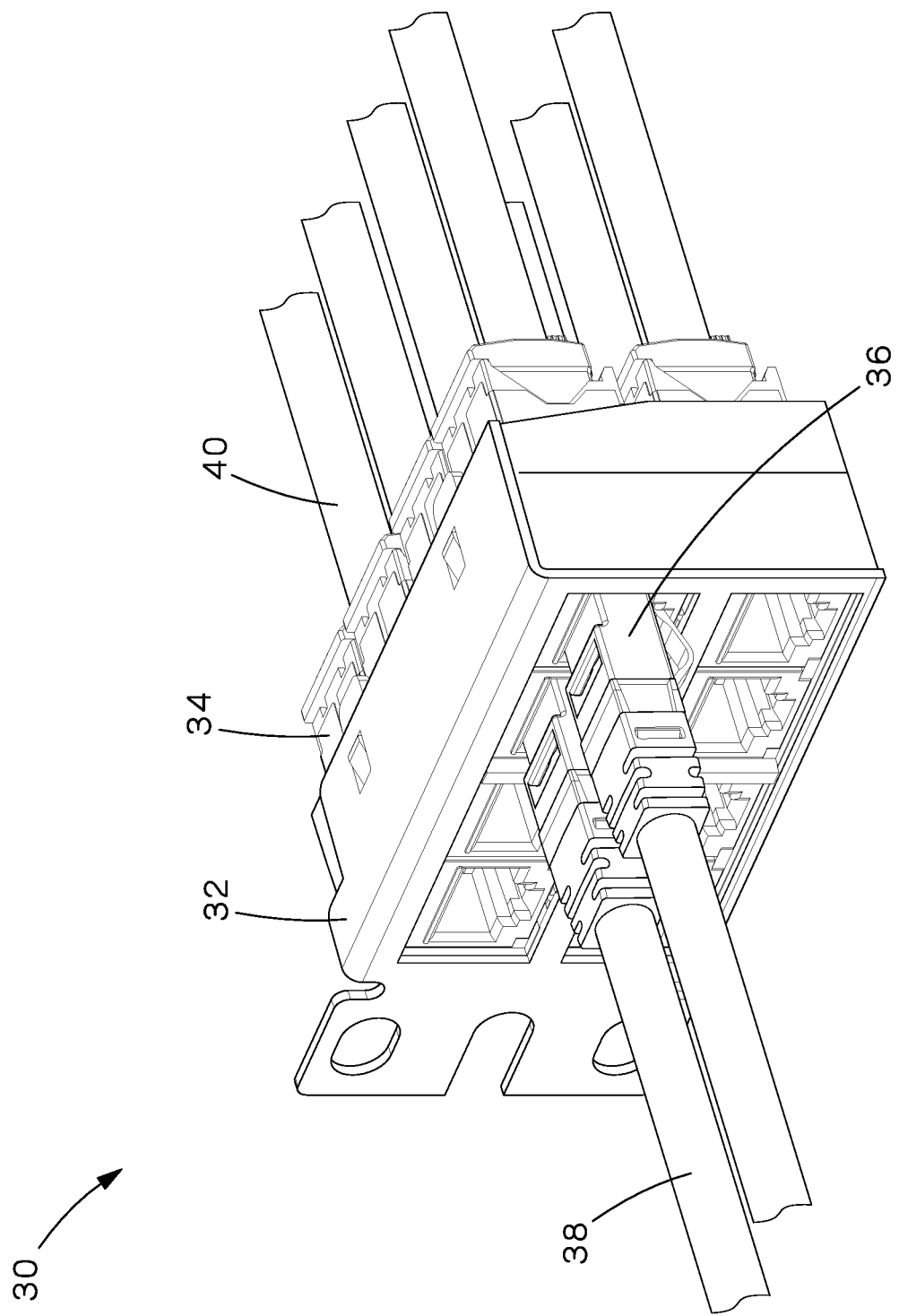
FIG. 1 is an isometric view of a communication system showing a patch panel capable of using high speed RJ45 jacks of the present invention.

The present invention is an RJ45 network jack. The plug interface contact (PIC) interface for contacts 3 and 6 is formed using a thin layer of contact material that is electrically insulated and wrapped over conductive mechanical spring contact that is connected to contact 6 and 3 respectively. The spring contact support at PIC position 3 is electrically connected to PIC interface 6 and spring contact support at position 6 is electrically connected to PIC interface 3. The PIC interface connection to spring contact is made such that it does not interfere with the plug mating. Reduced PIC interface thickness at position 3 and 6 reduces 2-3, 3-4, 5-6 and 6-7 crosstalk. PIC position 3 and 6 supports having connected to position 6 and 3 respectively, provides crosstalk compensation 2-6, 4-6, 3-5, and 3-7 close to the plug/jack mating interface.

FIG. 1 illustrates a communication system 30 which includes patch panel 32 with jacks 34 and corresponding plugs 36. Respective cables 40 are terminated to jacks 34, and respective cables 38 are terminated to plugs 36. Once a plug 36 mates with a jack 34, data can flow in both directions through these connectors. Although communication system 30 is illustrated as a patch panel in FIG. 1, alternatively it can be other active or passive equipment. Examples of passive equipment can be, but are not limited to, modular patch panels, punch-down patch panels, coupler patch panels, wall jacks, etc. Examples of active equipment can be, but are not limited to, Ethernet switches, routers, servers, physical layer management systems, and power-over-Ethernet equipment as can be found in data centers and or telecommunications rooms; security devices (cameras and other sensors, etc.) and door access equipment; and telephones, computers, fax machines, printers, and other peripherals as can be found in workstation areas. Communication system 30 can further include cabinets, racks, cable management, and overhead routing systems, and other such equipment.

Figure 2:
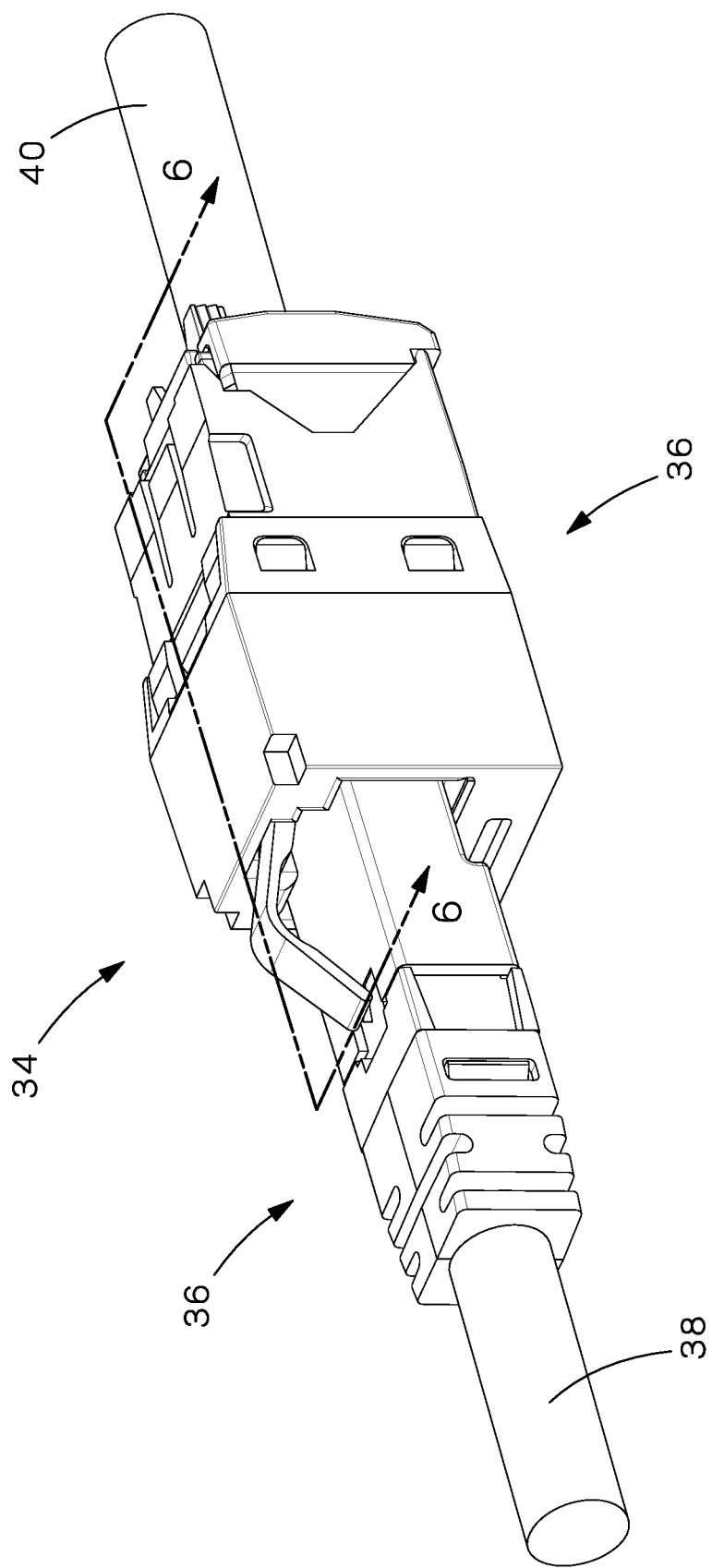
FIG. 2 is an isometric view of a high speed RJ45 jack of the present invention mated with a plug.

FIG. 2 illustrates network jack 34 mated with RJ45 plug 36. Note that in FIG. 2 the orientation of network jack 34 and RJ45 plug 36 is rotated 180° about the central axis of cable 40 as compared to the orientation from FIG. 1.

Figure 3:
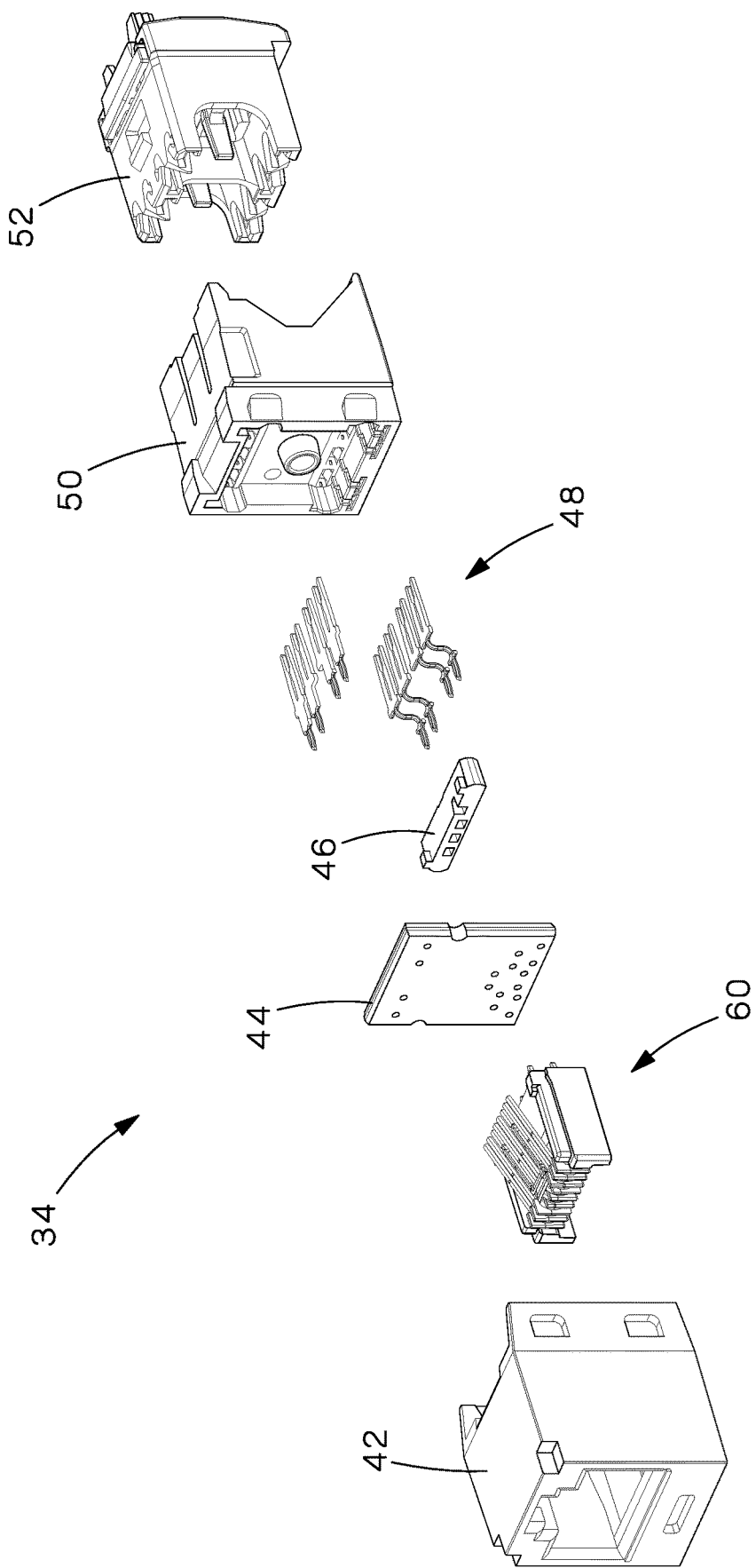
FIG. 3 is an exploded isometric view of the RJ45 jack of FIG. 2.

Referring now to FIG. 3, network jack 34 includes front housing 42, front sled assembly 60, PCB 44, insulation displacement contact (IDC) support 46, IDCs 48, rear housing 50, and wire cap 52. Jack 34 can additionally include an alien crosstalk reducing foil as described in U.S. Pat. No. 8,167,661 which is herein incorporated by reference in its entirety.

Figure 4:
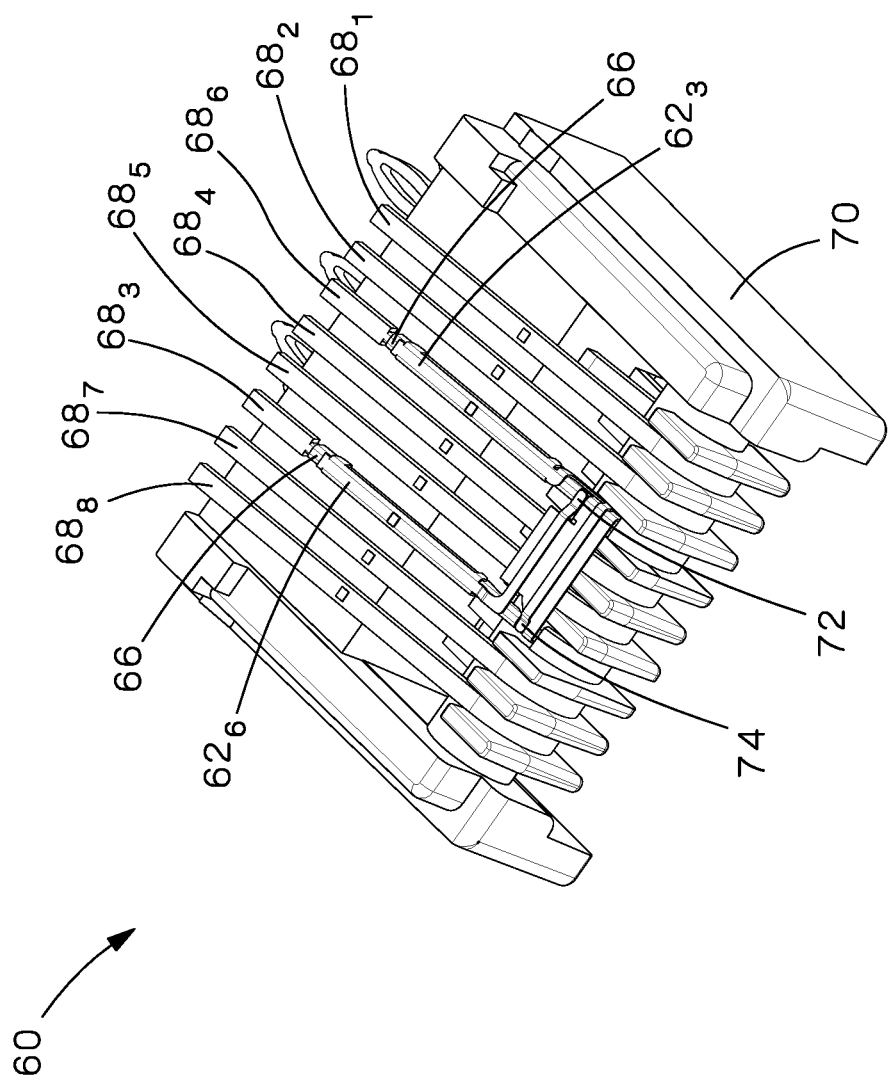
FIG. 4 is a rotated isometric view of a front sled assembly to be used in the high speed connector of FIG. 2.

FIG. 4 is a rotated isometric view of front sled assembly 60. It includes PICs 68$_1$ through 68$_8$, PIC covers 62$_3$ and $62_6$, insulator 66, and sled 70. The subscript numbers of PICs and PIC covers represent RJ45 pin positions as defined by ANSI/TIA-568-C.2. PIC covers $62_3$ and $62_6$ interface with plug contacts electrically. PICs $68_6$ and $68_3$ provide mechanical support at PIC positions $62_3$ and $62_6$, respectively. Insulator 66 electrically isolates PIC covers $62_3$ and $62_6$ from PICs $68_6$ and $68_3$, respectively. PIC cover $62_3$ electrically connects to PIC $68_3$ at location 74. PIC Cover $62_6$ electrically connects to PIC $68_6$ at location 72.

FIG. 5 is an exploded view of sled assembly 60 with PICs 68, PIC covers 62, insulator 66, and sled 70.

Figure 6:
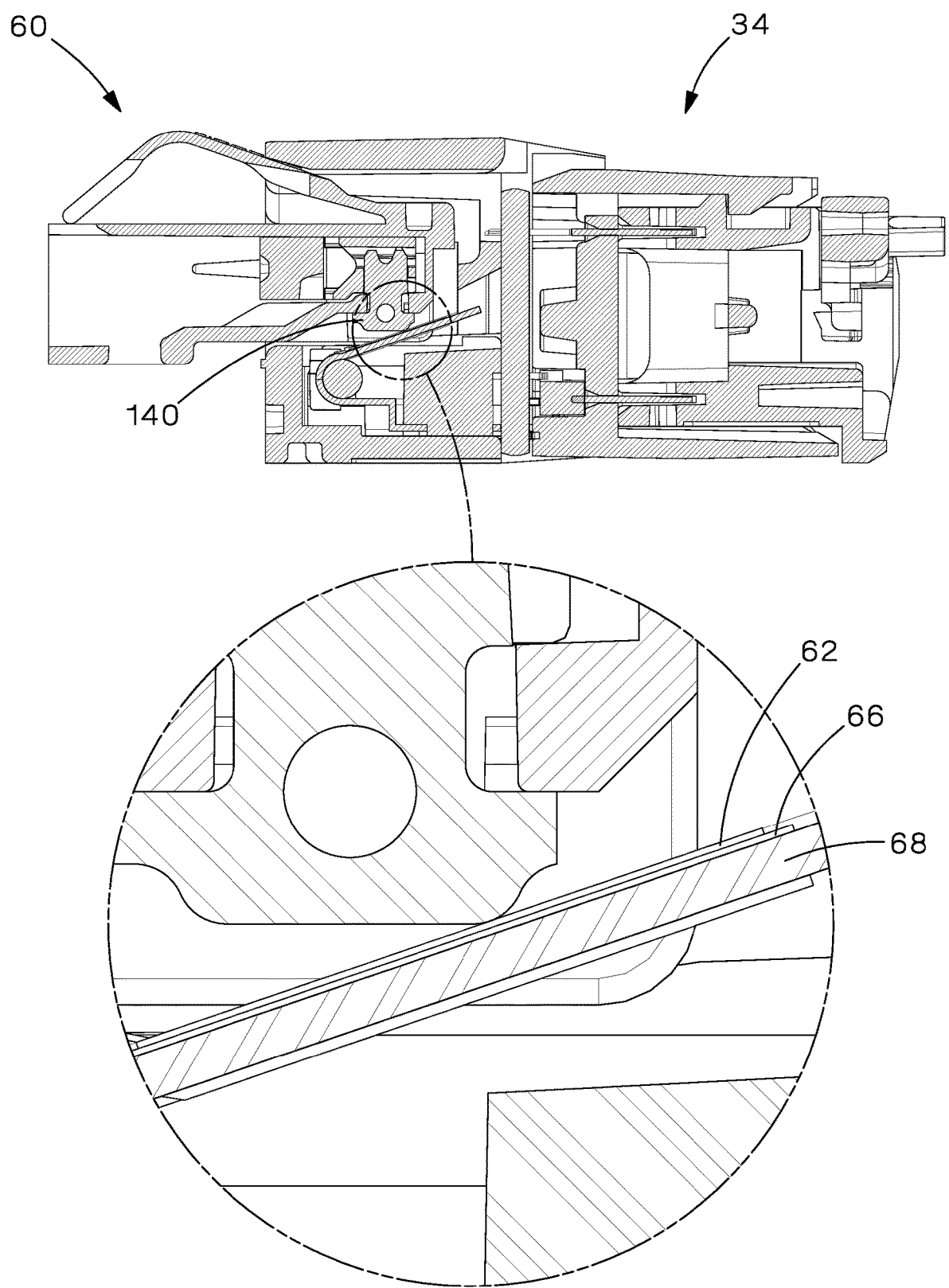
FIG. 6 is a cross-sectional view of the mated plug and jack of FIG. 2 taken along line 6-6.

FIG. 6 is a cross-sectional view of a mated plug 36 and jack 34 taken about section line "6-6" in FIG. 2. It illustrates plug contact 140, PIC 68, and PIC cover 62 in a mated position. Insulator 66 electrically isolates PIC cover 62 from PIC 68 at contact positions 3 and 6.

Figure 7:
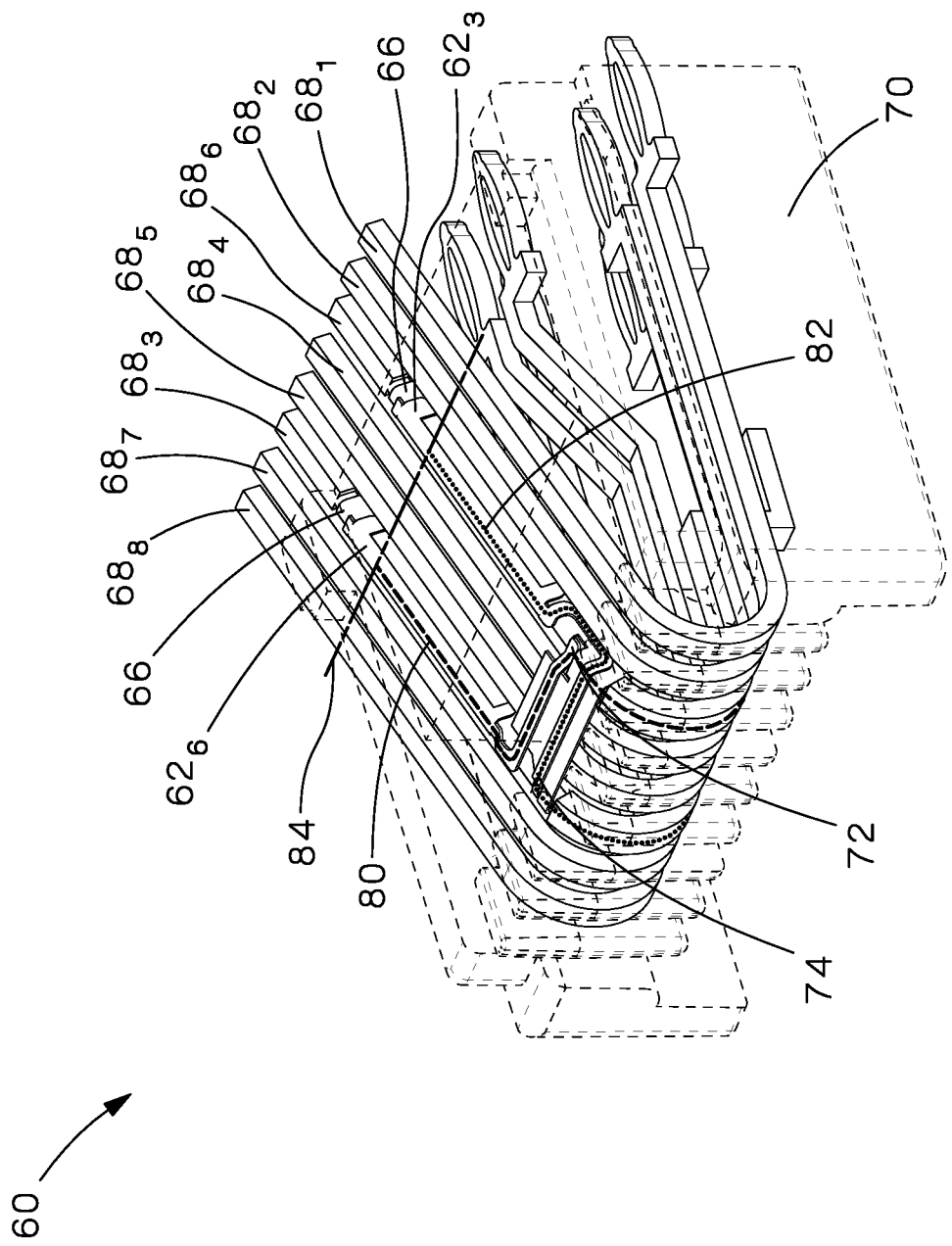
FIG. 7 is an isometric view of the front sled assembly of FIG. 4 (with the sled being shown as a dashed outline) highlighting the signal paths of the 3-6 split pair.

FIG. 7 is an isometric view of sled assembly 60 showing signal path 80 (bold dashed line) for contact position 6 and signal path 82 (bold dotted line) for contact position 3 from plug mating point shown by line 84. Sled 70 is shown as a dashed outline for reference. For contact position 3, PIC cover $62_3$ electrically connects to plug contact 3 and to PIC $68_3$ at location 74. PIC cover $62_3$ is mechanically connected to (but electrically insulated from) PIC $68_6$. PIC $68_6$ provides spring force to PIC Cover $62_3$ at the plug contact interface. PIC $68_6$ is located between PIC $68_2$ and $68_4$ and provides compensating crosstalk coupling 2-6 and 4-6. The relatively small cross section of PIC cover $62_3$ reduces 2-3 and 3-4 crosstalk due to its coupling with $68_2$ and $68_4$. Similarly, for contact position 6, PIC cover $62_6$ electrically connects to plug contact 6 and to PIC $68_6$ at location 72. PIC cover $62_6$ is mechanically connected to (but electrically insulated from) PIC $68_3$. PIC $68_3$ provides spring force to PIC Cover $62_6$ at the plug contact interface. PIC $68_3$ is located between PIC $68_7$ and $68_5$ and provides compensating crosstalk coupling 3-7 and 3-5. The relatively small cross section of PIC cover $62_6$ reduces 5-6 and 6-7 crosstalk due to its coupling with $68_5$ and $68_7$. In addition, PIC cover $62_3$ coupling with PIC $68_6$ and PIC cover $62_6$ coupling with PIC $68_3$ helps to offset the impedance mismatch due to the 3-6 pair split, resulting in improved return loss performance.

Figure 8:
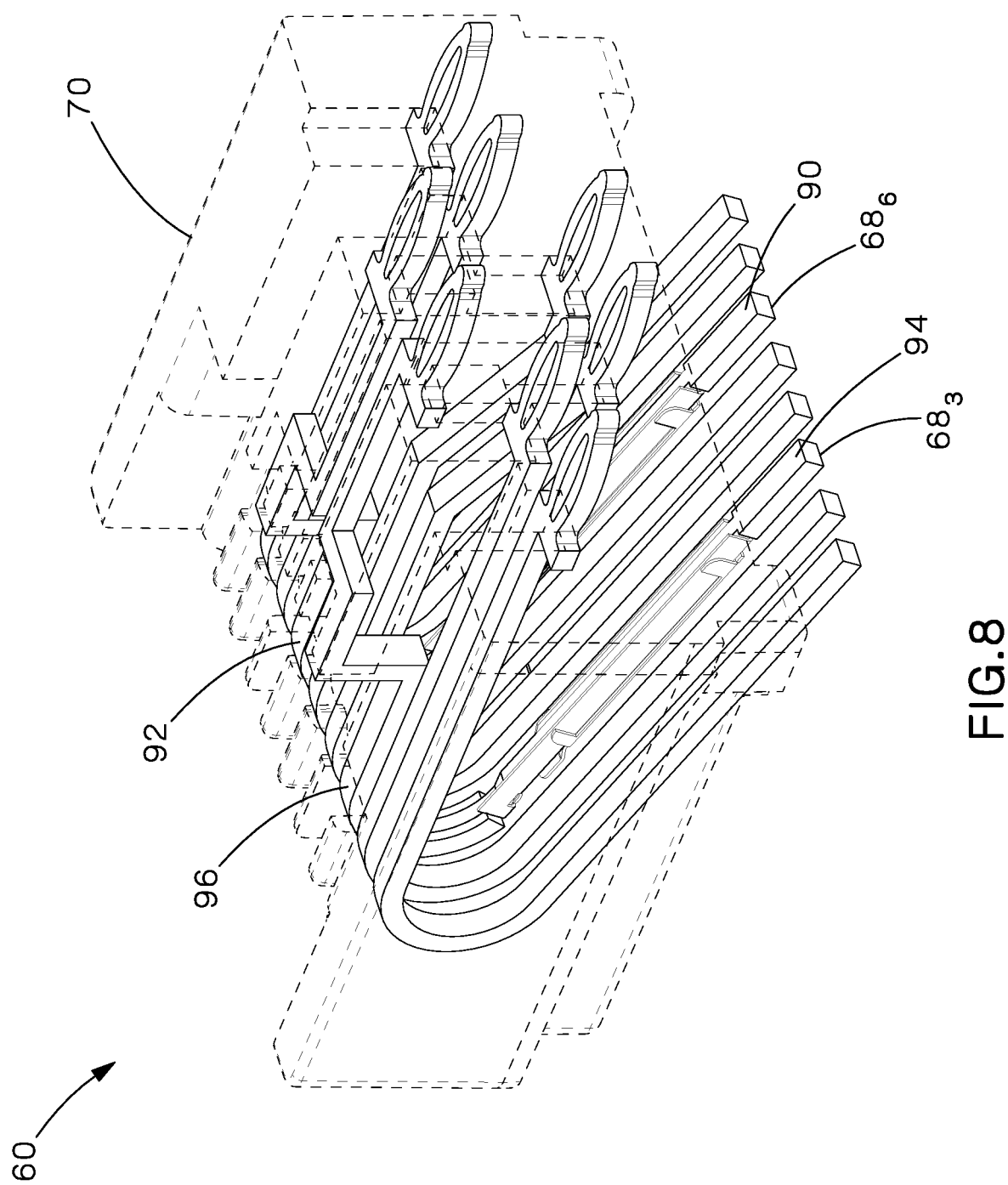
FIG. 8 is an isometric view from the bottom of the front sled assembly of FIG. 7.

FIG. 8. is an isometric view of sled assembly 60 looking from the bottom. It shows contact $68_3$ and $68_6$ with tuning lengths 94, 96 and 90, 92 respectively. Tuning length can be optimized in width and/or length to have desired compensation coupling.

Figure 9:
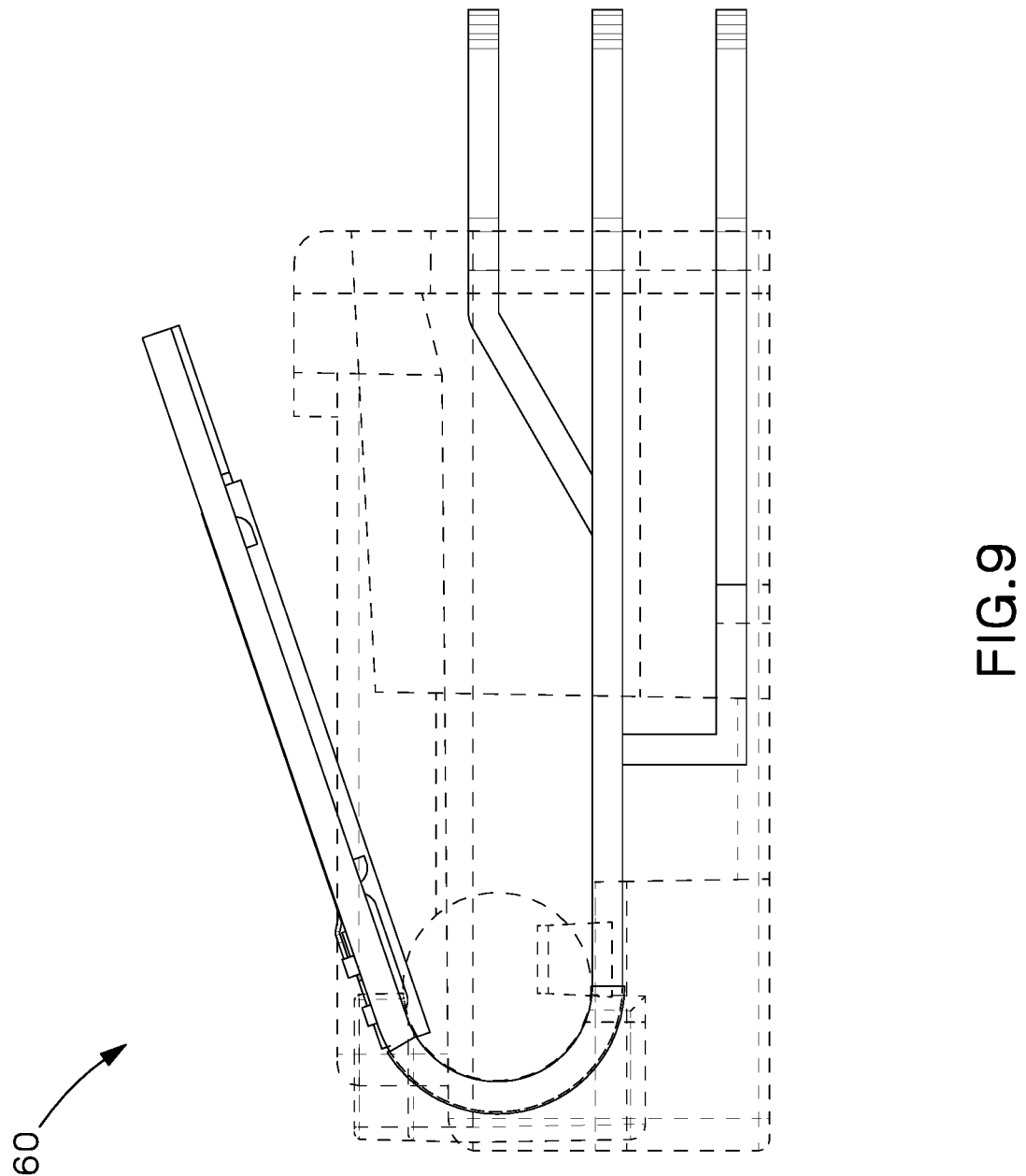
FIG. 9 is a side view of the front sled assembly of FIG. 7.

FIG. 9. illustrates sled assembly 60 in side view.

Insulator 66 can be a nonconductive label applied with adhesive and/or heat or other insulating coatings including but not limited to polymer and conformal coatings.

Figure 10:
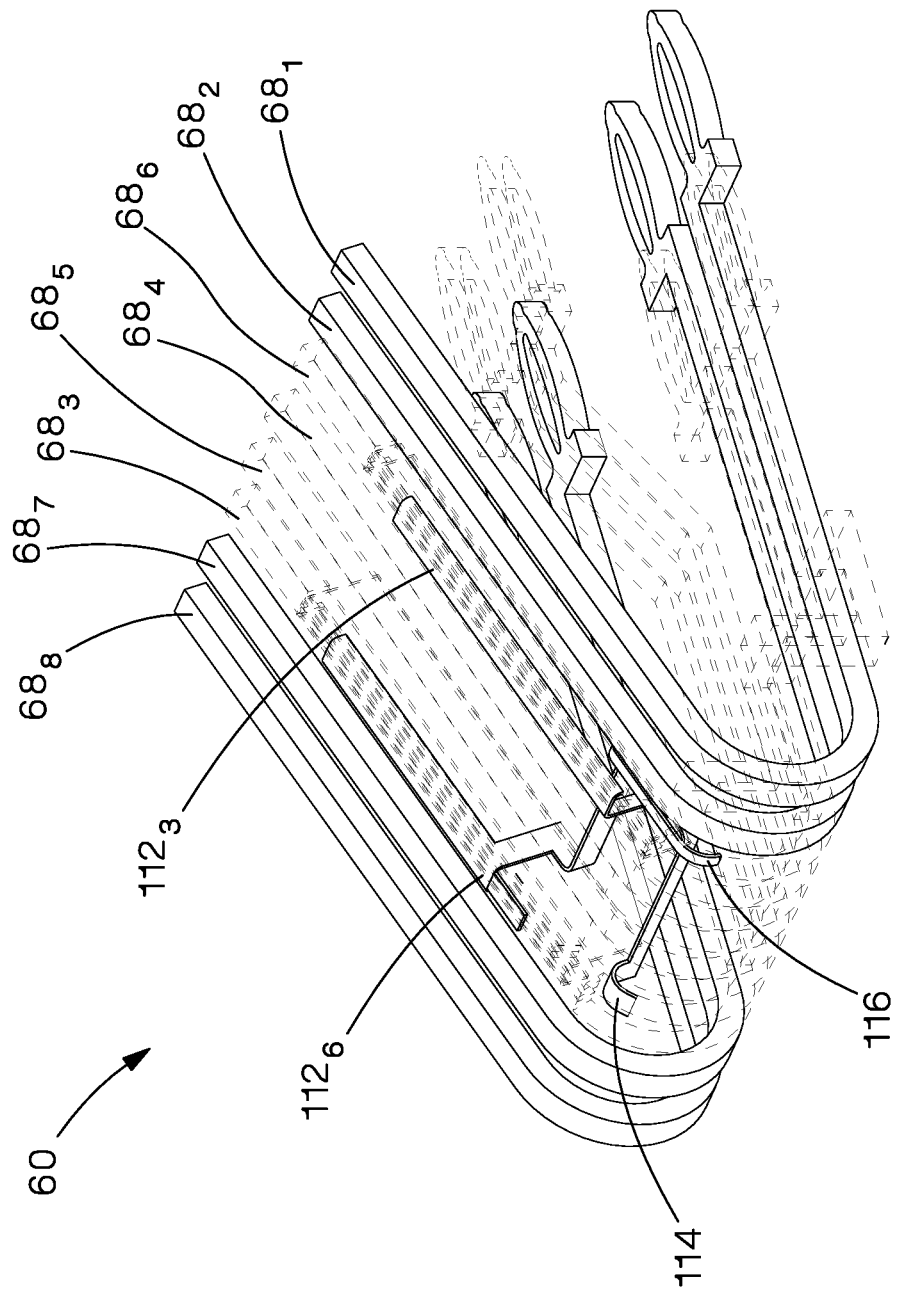
FIG. 10 is an isometric view of a contact assembly of a first alternate sled assembly for the high speed RJ45 jack of FIG. 2.
Figure 11:
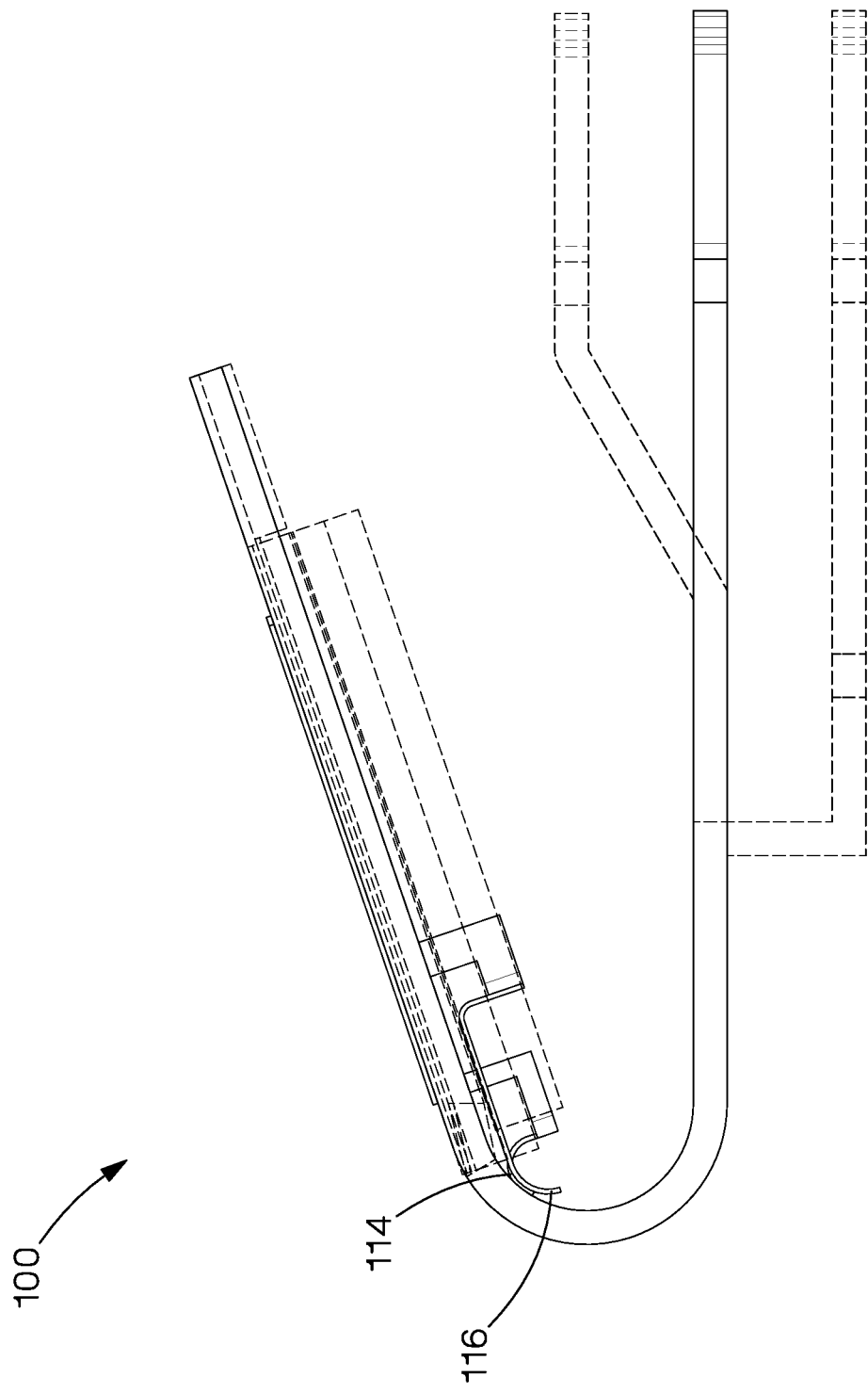
FIG. 11 is a side view of the contact assembly of FIG. 10.
Figure 12:
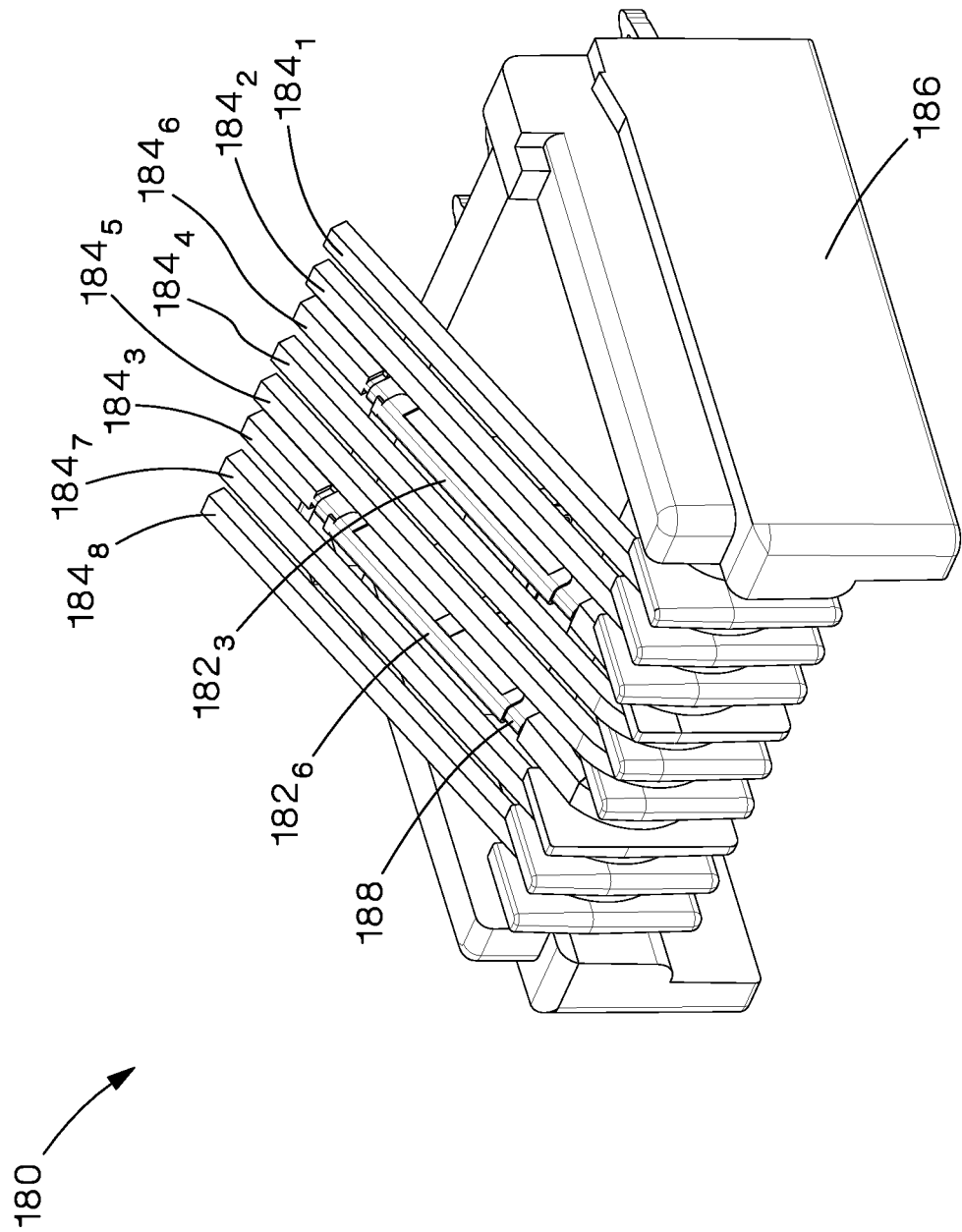
FIG. 12 is an isometric view of a second alternate sled assembly for the high speed RJ45 jack of FIG. 2.
Figure 13:
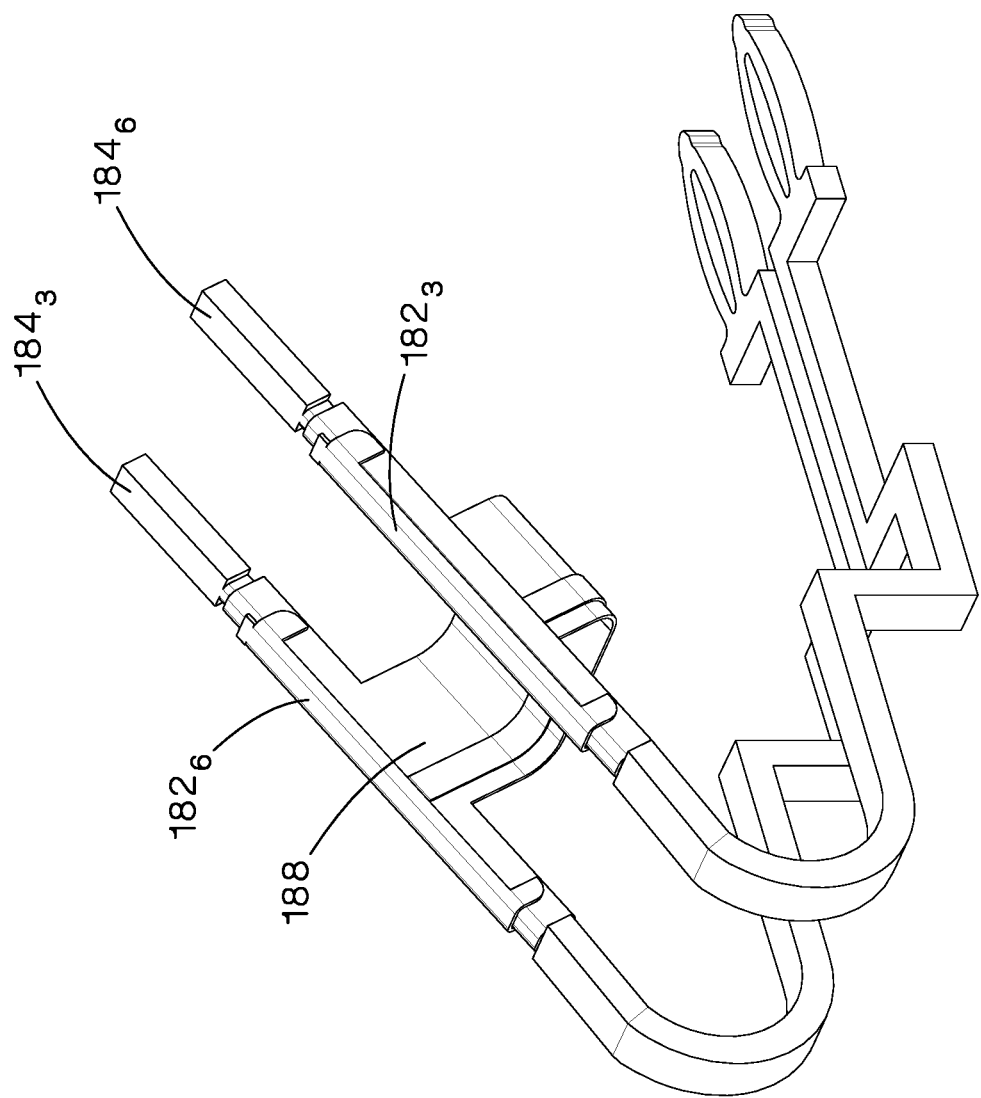
FIG. 13 is the 3-6 split pair contact assembly for the front sled assembly of FIG. 12 including PICs, PIC cover and flexible PCB.
Figure 14:
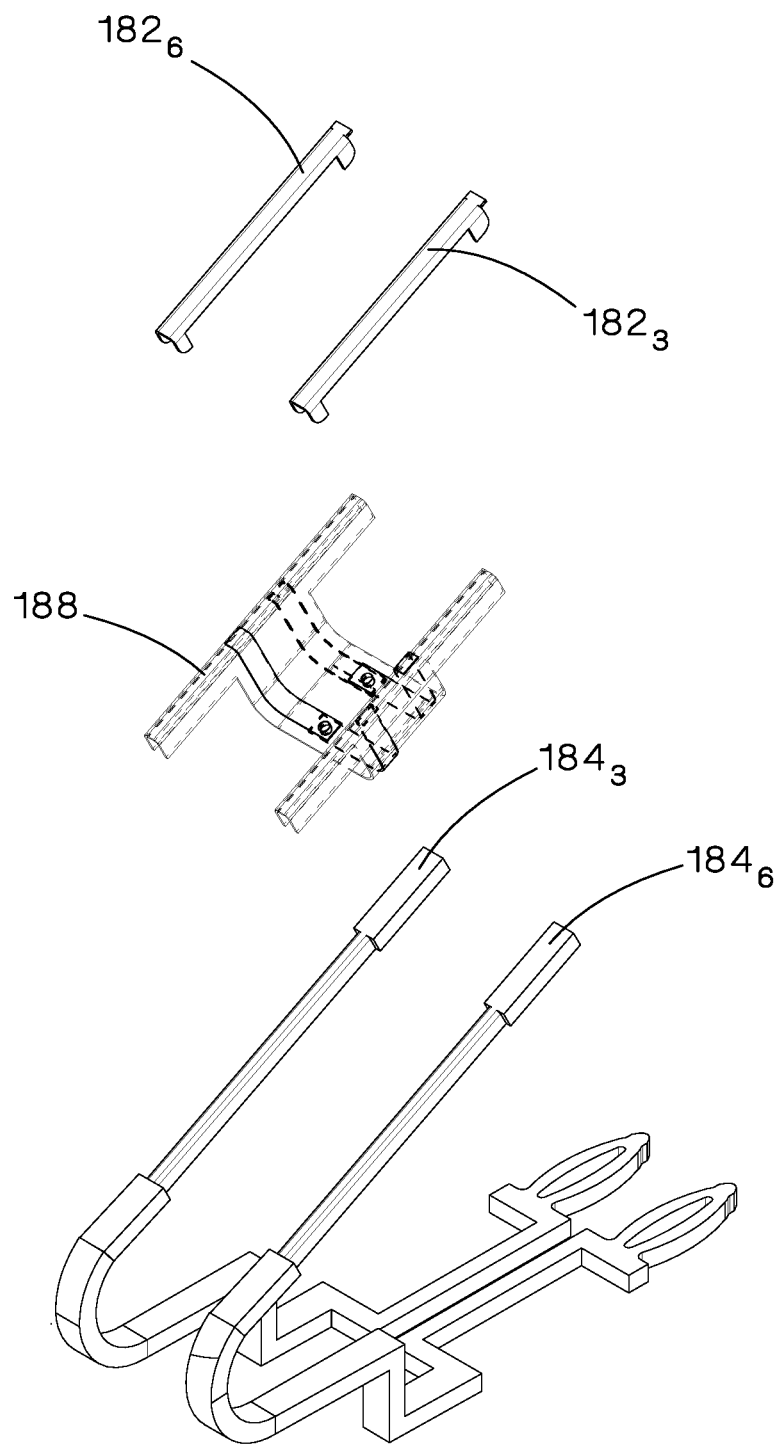
FIG. 14 is an exploded isometric view of the 3-6 split pair PIC assembly of FIG. 13.

In a second embodiment of the present invention, an alternate sled assembly 100 (shown in FIGS. 10 and 11) PIC covers $112_3$ and $112_6$ extend under PICS $68_4$ and $68_5$ to be electrically connected on bottom face of the PIC $68_3$ and $68_6$, respectively. PIC cover $112_3$ is connected at location 114 and PIC cover $112_6$ is connected at 116.

Figure 15:
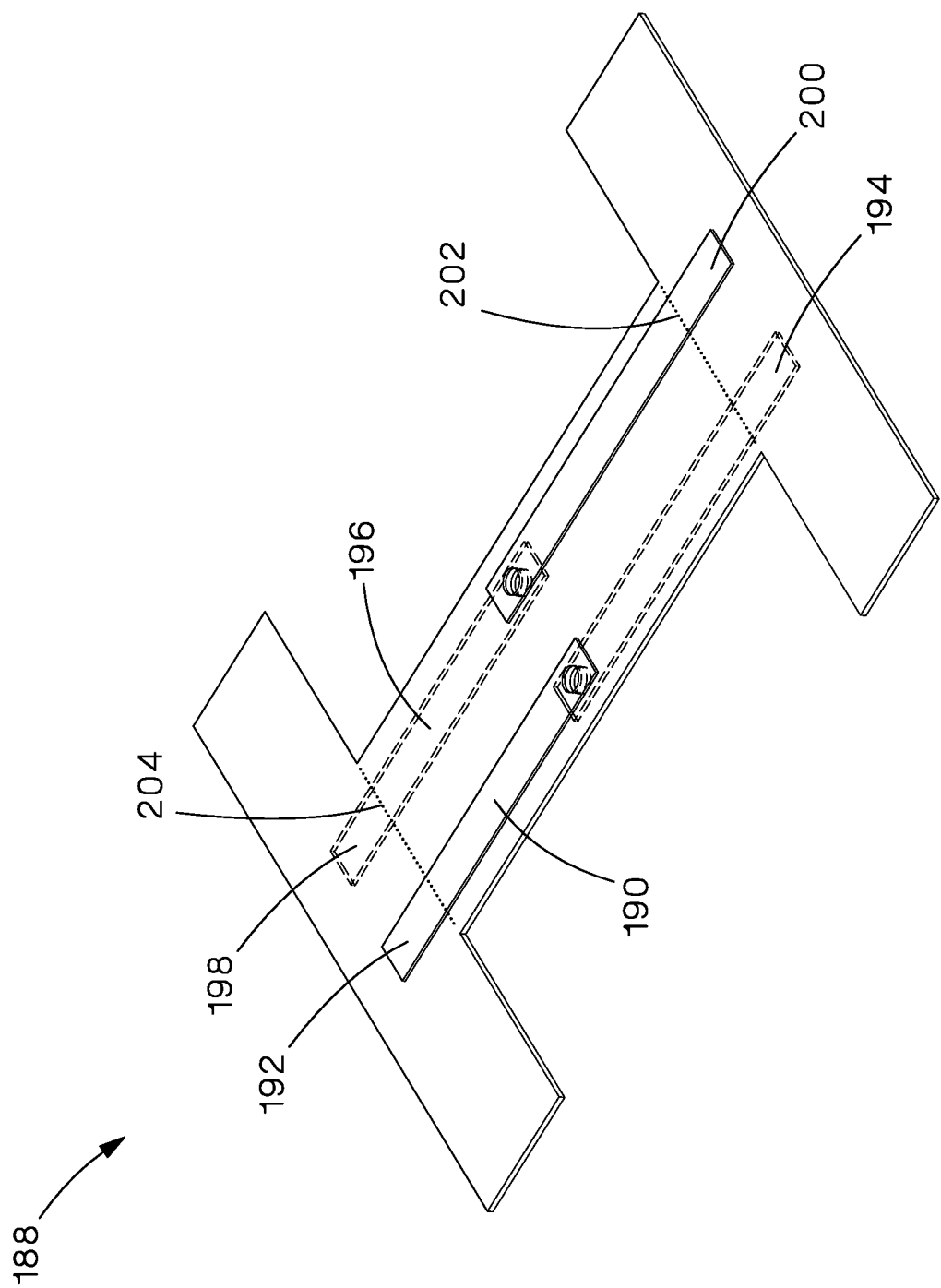
FIG. 15 is an isometric view of a flexible PCB for use with the split-pair PIC assembly of FIG. 13.

In a third embodiment of the present invention, an alternate sled assembly 180 (shown in FIGS. 12 to 15) contains PIC covers $182_3$ and $182_6$ that are electrically isolated from supporting PICs 184 by flexible PCB 188. Flexible PCB trace 190 (FIG. 15) connects PIC cover $182_6$ to PIC $184_6$ electrically at contact points 192 and 194 respectively. Flexible PCB trace 196 connects PIC cover $182_3$ to PIC $184_3$ electrically at contact points 200 and 198 respectively. Traces 190 and 196 are covered with insulating cover lay between lines 202 and 204. Flexible PCB allows PIC cover and PIC connection path to be brought closer to the plug/jack mating interface.

Figure 16:
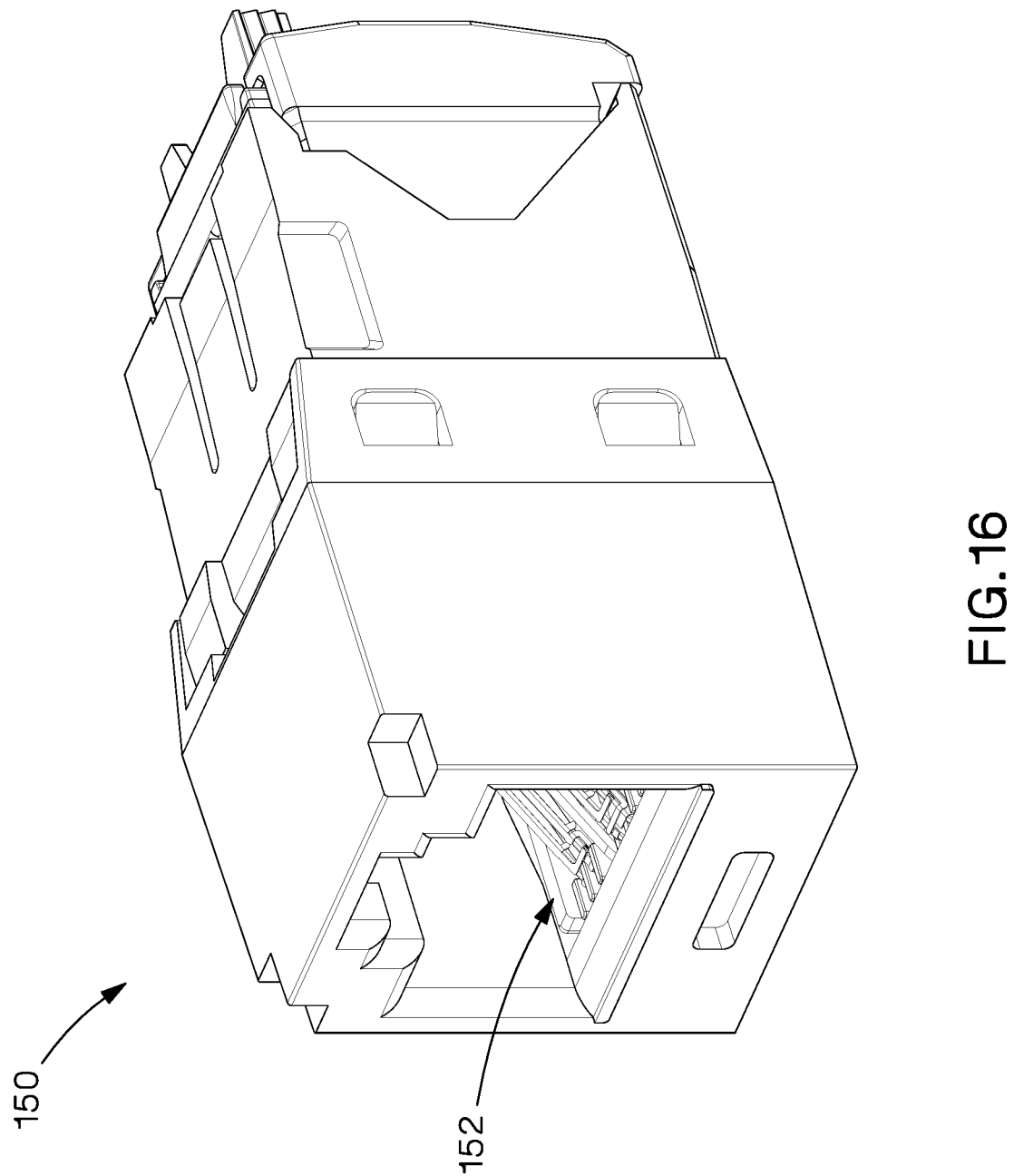
FIG. 16 is an isometric view of a high speed RJ45 jack with a third alternate front sled assembly.
Figure 17:
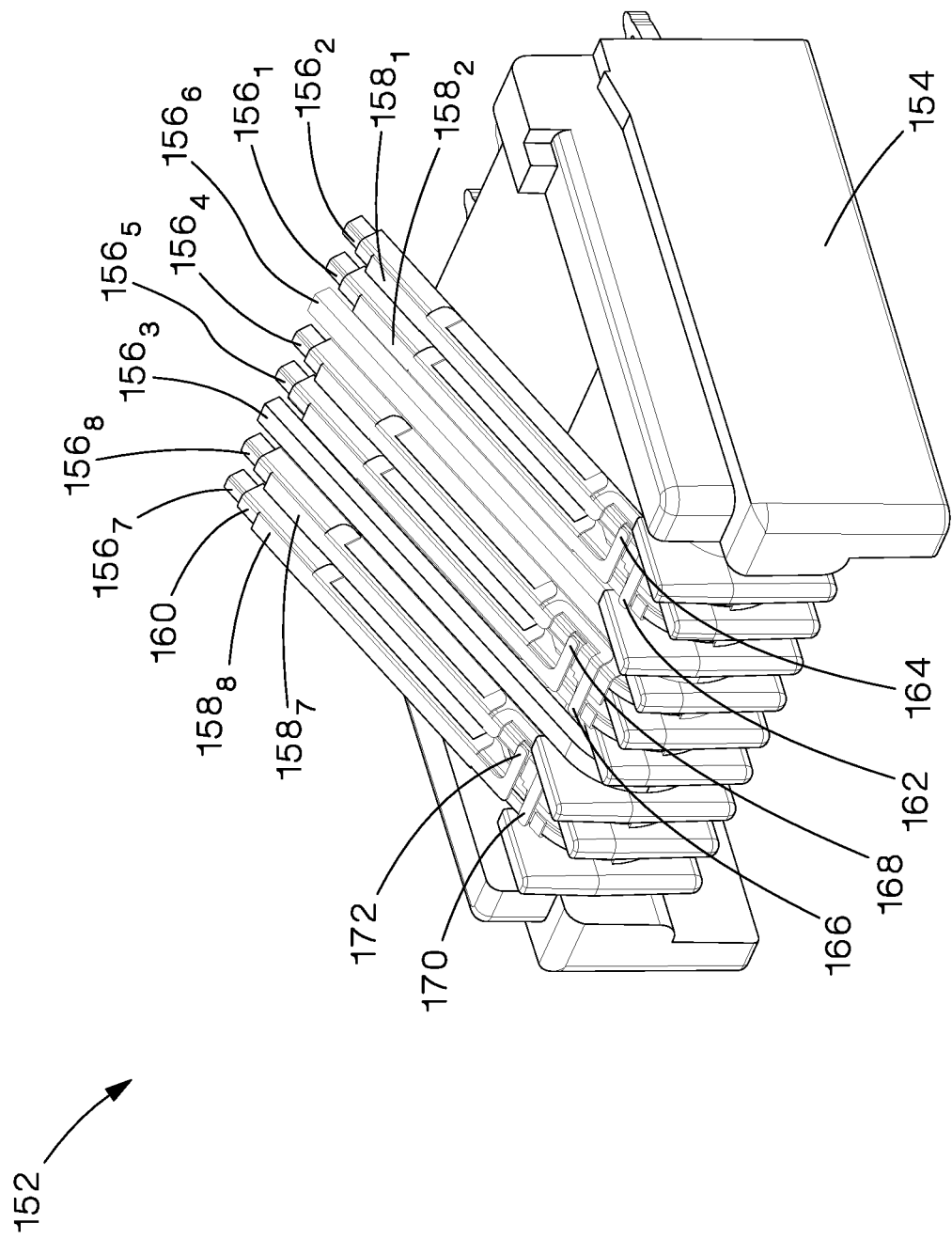
FIG. 17 is an isometric view of the third alternate sled assembly for the jack of FIG. 16.
Figure 18:
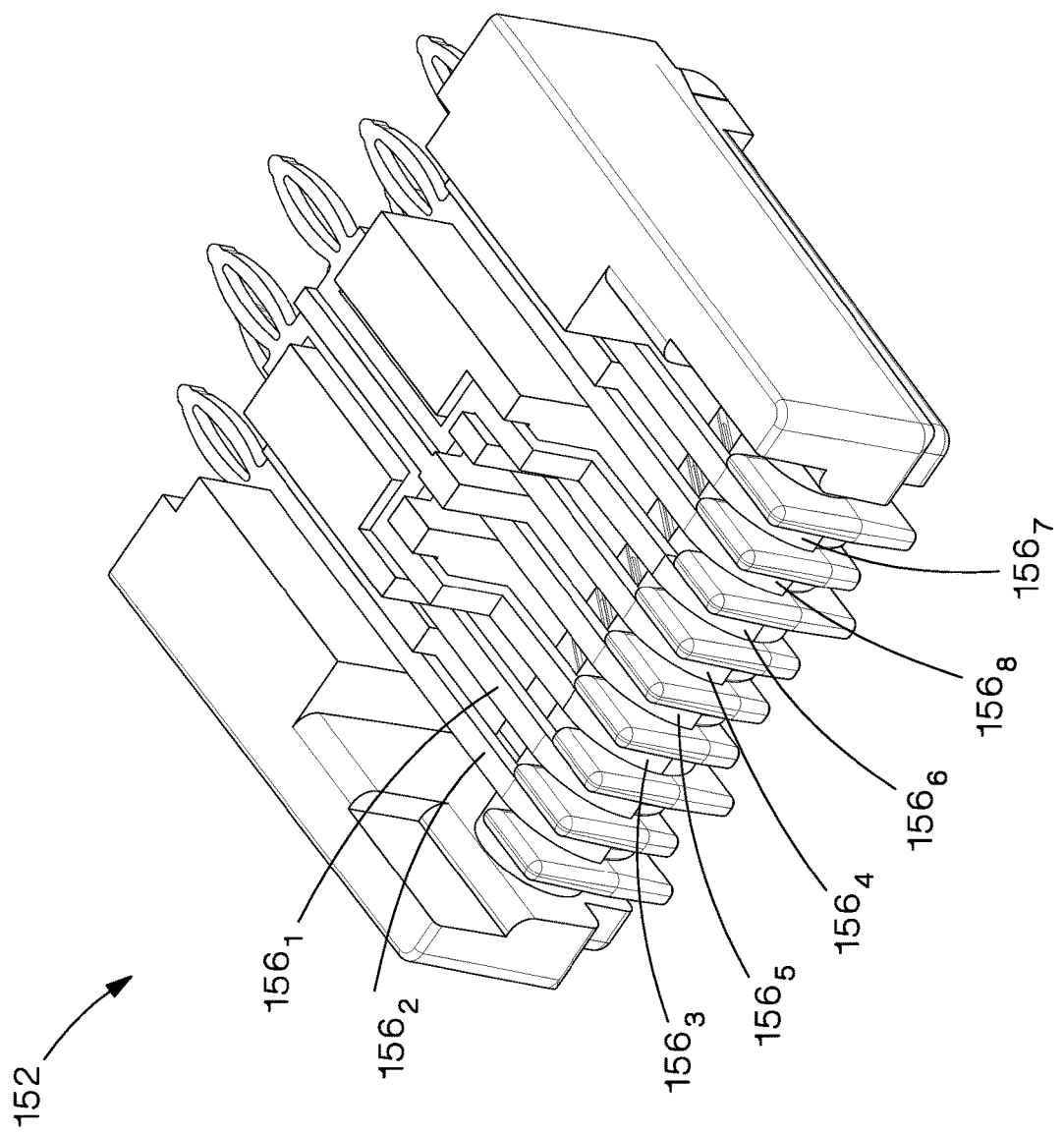
FIG. 18 is an isometric view from the bottom of the front sled assembly of FIG. 17.

In a fourth embodiment (shown in FIGS. 16 to 18), jack 150 includes sled assembly 152 with sled 154, PICs 156, PIC covers 158 and insulator 160. In this embodiment PIC covers 158 interface plug contacts at positions 1, 2, 4, 5, 7 and 8. PIC covers $158_1$, $158_2$, $158_4$, $158_5$, $158_7$, $158_8$ are mechanically supported but electrically isolated from PICs $156_2$, $156_1$, $156_5$, $156_4$, $156_8$ and $156_7$ respectively to provide spring force. PIC cover $158_1$ connects to PIC $156_1$ at 162, PIC cover $158_2$ connects to PIC $156_2$ at 164, PIC cover $158_4$ connects to PIC $156_4$ at 166, PIC cover $158_5$ connects to PIC $156_5$ at 168, PIC cover $158_7$ connects to PIC $156_7$ at 170, PIC cover $158_8$ connects to PIC $156_8$ at 172. PICs $156_3$ and $156_6$ position relative to $156_1$, $156_4$, $156_5$ and $156_7$ provide compensating coupling 13, 35, 46 and 68 while reducing PIC crosstalk coupling 23, 34, 56 and 67.

While particular embodiments and applications of the present invention have been illustrated and described, it is to be understood that the invention is not limited to the precise construction and compositions disclosed herein and that various modifications, changes, and variations may be apparent from the foregoing without departing from the spirit and scope of the invention as described.

The invention claimed is:

1. A communication connector comprising:
   a housing with an opening;
   a sled assembly contained within the housing wherein the sled assembly has a plurality of contacts accessible via the opening; and
   a plug interface contact (PIC) cover at least partially surrounding a first contact of the plurality of contacts wherein the PIC cover is electrically insulated from the first plug interface contact of the plurality of contacts and electrically connected to a second plug interface contact of the plurality of contacts wherein partially surrounding is defined as covering at least half of an outer circumference of a contact.

2. The communication connector of claim 1 further comprising a second PIC cover at least partially surrounding a third plug interface contact of the plurality of plug interface contacts, the second PIC cover being electrically insulated from the third plug interface contact and electrically connected to a fourth plug interface contact of the plurality of plug interface contacts.

3. The communication connector of claim 2 wherein the first PIC cover is electrically connected to the second plug interface contact via an arm extending from the first PIC cover towards the second plug interface contact.

4. The connector of claim 1 wherein the PIC cover is electrically connected to the second plug interface contact via a flexible printed circuit board.

* * * * *